Figure 1:
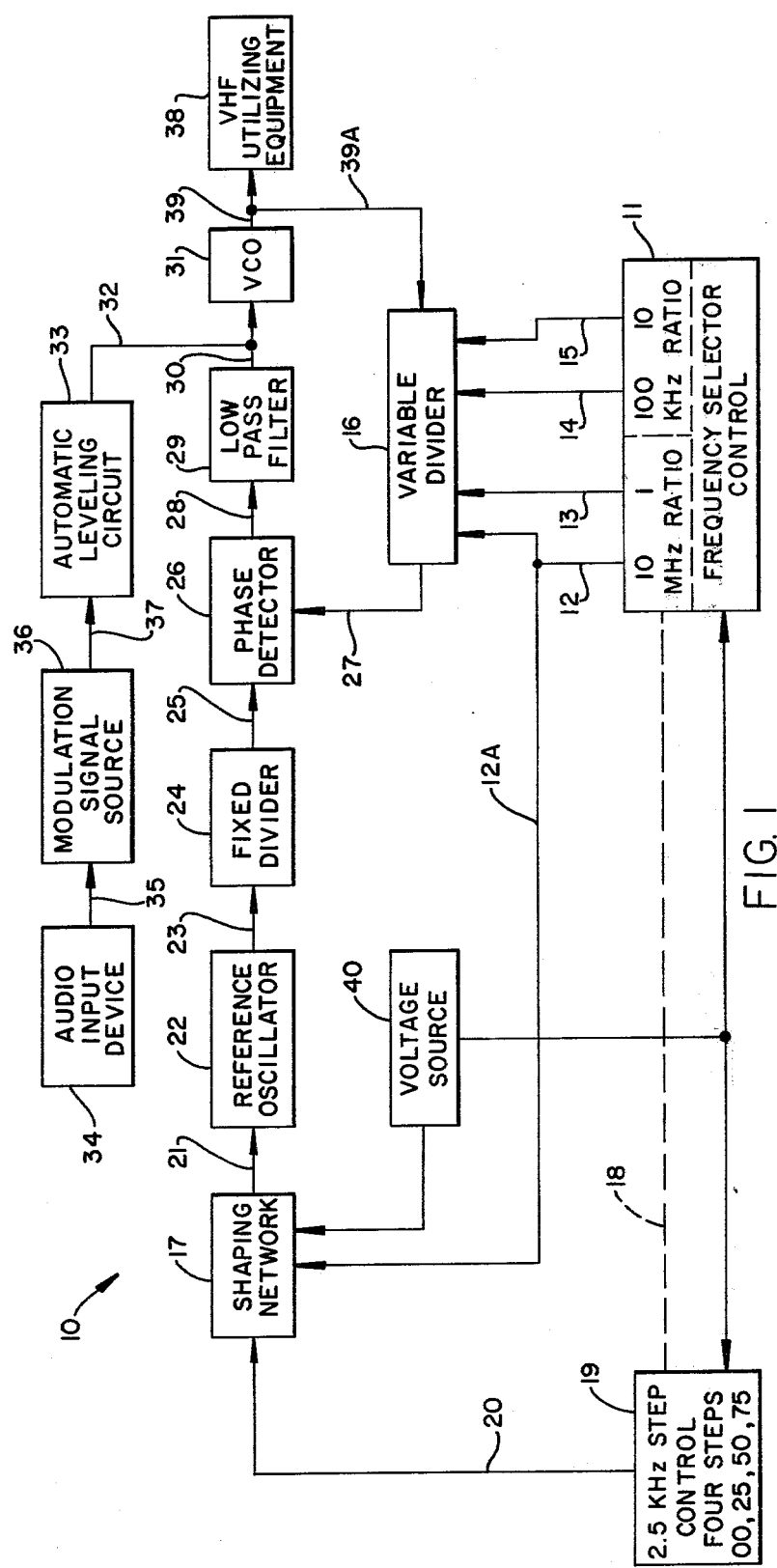

United States Patent [19]

Triplett

[11] 4,189,689
[45] Feb. 19, 1980

[54] AUTOMATIC LEVELING STABILIZED VHF-FM FREQUENCY SYNTHESIZER

[75] Inventor: Gregory L. Triplett, Olathe, Kans.

[73] Assignee: Wulfsberg Electronics, Inc., Overland Park, Kans.

[21] Appl. No.: 959,676

[22] Filed: Nov. 13, 1978

Related U.S. Application Data

[63] Continuation of Ser. No. 811,628, Jun. 30, 1977, abandoned.

[51] Int. Cl.² .................................................. H03C 3/04
[52] U.S. Cl. .................................. 332/18; 325/147; 325/148; 331/23; 331/25; 332/19
[58] Field of Search .................. 332/16 R, 18, 19; 325/45, 46, 145, 147, 148; 331/23, 25

[56] References Cited

U.S. PATENT DOCUMENTS

| | | | |
|---|---|---|---|
| 3,225,304 | 12/1965 | Richards | 330/59 X |
| 3,393,380 | 7/1968 | Webb et al. | 332/19 |
| 3,699,468 | 10/1972 | Harmgardt | 330/59 X |
| 4,030,034 | 6/1977 | Ruegg | 325/319 |
| 4,052,672 | 10/1977 | Enderby et al. | 325/147 |

OTHER PUBLICATIONS

Weisbecker, "Designing a Feedback System", Electronic Design, vol. 13, No. 18, Aug. 30, 1965, pp. 32, 34, 35.

Primary Examiner—Siegfried H. Grimm
Attorney, Agent, or Firm—Warren H. Kintzinger

[57] ABSTRACT

An automatic modulation leveling circuit gain controlled by the tuning voltage level into the voltage controlled oscillator of an FM frequency synthesizer providing a normalized modulation gain. The automatic modulation leveling circuit is used in a basic 10 KHz tuning increment direct synthesizer with a skewed frequency standard deriving four intermediate tuning steps of 2.5 KHz each. The leveling circuit includes an amplifier with gain to both DC and AC set by the ratio of a feedback resistor to the value of an input resistor that is a photo resistor subject to resistance change with light variance of a light emitting diode as driven by a second amplifier in the circuit. The second amplifier provides, in the circuit environment, an output responsive to frequency synthesizer tuning voltage with gain such as to result in a certain level of modulation across the RF tuning band being proportional to the tuning voltage and automatic adjustment of leveling circuit gain to the proper level as indicated and determined by the tuning voltage into the VCO for substantially uniform deviation across the entire tuning band.

10 Claims, 2 Drawing Figures

AUTOMATIC LEVELING STABILIZED VHF-FM FREQUENCY SYNTHESIZER

This is a continuation of application Ser. No. 811,628, filed June 30, 1977 and now abandoned.

This invention relates to frequency synthesizers such as a direct synthesizer with modulation applied to the VCO (voltage controlled oscillator) tuning voltage, and in particular, to an automatic modulation leveling circuit controlled by the tuning voltage level and providing a normalized modulator gain.

My new modulation leveling circuit that is controlled by a frequency synthesizer tuning voltage has been implemented with a VHF-FM basic 10 KHz increment, single loop direct synthesizer, with a skewed frequency standard deriving four intermediate steps of 2.5 KHz each such as taught and claimed in a copending application, Ser. No. 959,642, filed on the same date herewith and entitled "VHF-FM FREQUENCY SYNTHESIZER" of which I am a co-inventor with others and which is assigned to a common assignee. Detail of common circuit blocks shown in the identified copending application are to be considered as being incorporated by reference herein.

There are many existing frequency synthesizers with some so arranged that a single reference frequency determines the minimum frequency change or adjustment step available with the synthesizer. This type system limits phase locked loop servo bandwidth and does not always yield the desired level of voltage controlled oscillator quieting close in to its, or carrier, center frequency. Synthesizers employing phase modulation do not permit transmission of subaudible tones, and settling time of frequency change with many synthesizers is too slow to accommodate semi-duplex operation. Signal to noise ratio is also an important consideration as well as low pass filtration in the phase locked loop such as to allow voice band modulation. It is important that modulation of the frequency synthesizer be accomplished to the VCO tuning voltage with a low pass filter in the phase locked loop which would allow voice band modulation (this is possible with 10 KHz increment tuning steps in a direct synthesizer and a 2.5 KHz tuning step skewed frequency standard deriving four intermediate steps while 2.5 KHz increment tuning steps applied as are the 10 KHz tuning steps would not permit voice band modulation of the VCO). With a frequency synthesizer such as this direct FM, as opposed to phase modulation is employed, so that subaudible tones may be transmitted. Various standards are imposed such as that the applied modulation 3 db bandwidth shall be 30 Hz to 3500 Hz with standard EIA RS-152-B in the voice band and that this be provided in a single loop synthesizer for simplicity of design and spectral purity. Modulation drive requirements to produce the necessary deviation changes between band ends changes so automatic modulation drive leveling is provided.

It is, therefore, a principal object of this invention to provide automatic modulation drive leveling of the modulation applied to the VCO tuning voltage in a direct frequency synthesizer.

Another object with such a frequency synthesizer is automatic modulation drive leveling that re-adjusts peak modulation voltage through normalized modulator gain to maintain substantially constant deviation limits across the entire tuning band.

A further object is that such automatic modulation drive leveling be provided in a single loop phase locked loop VHF-FM frequency synthesizer having 2.5 KHz increment tuning steps that allows voice band modulation.

Features of this invention useful in accomplishing the above objects is use of a basic 10 KHz increment, direct synthesizer, with a skewed frequency standard deriving four intermediate tuning steps of 2.5 KHz each, equipped with automatic modulation drive leveling. The automatic modulation leveling circuit includes an amplifier with gain to both DC and AC set by the ratio of a feedback resistor to the value of an input resistor that is a photo resistor subject to resistance change with light variance of a light emitting diode. This causes, in the circuit environment, the signal applied as an input to the amplifier to be amplified as determined by the DC gain of the circuit that, in turn, has been set by the frequency synthesizer tuning voltage appearing on a line into the synthesizer VCO. With the gain required to give a certain level of modulation across the RF band being proportional to the tuning voltage the leveler circuit automatically adjusts that gain to the proper level as indicated and determined by the tuning voltage into the VCO. An additional amplifier in the leveling circuit is selected and/or adjusted such as to respond only to the frequency range from DC to approximately 2 Hz so as to ignore AC on the tuning voltage line to the frequency synthesizer VCO.

A specific embodiment representing what is presently regarded as the best mode of carrying out the invention is illustrated in the accompanying drawings.

Figure 2:
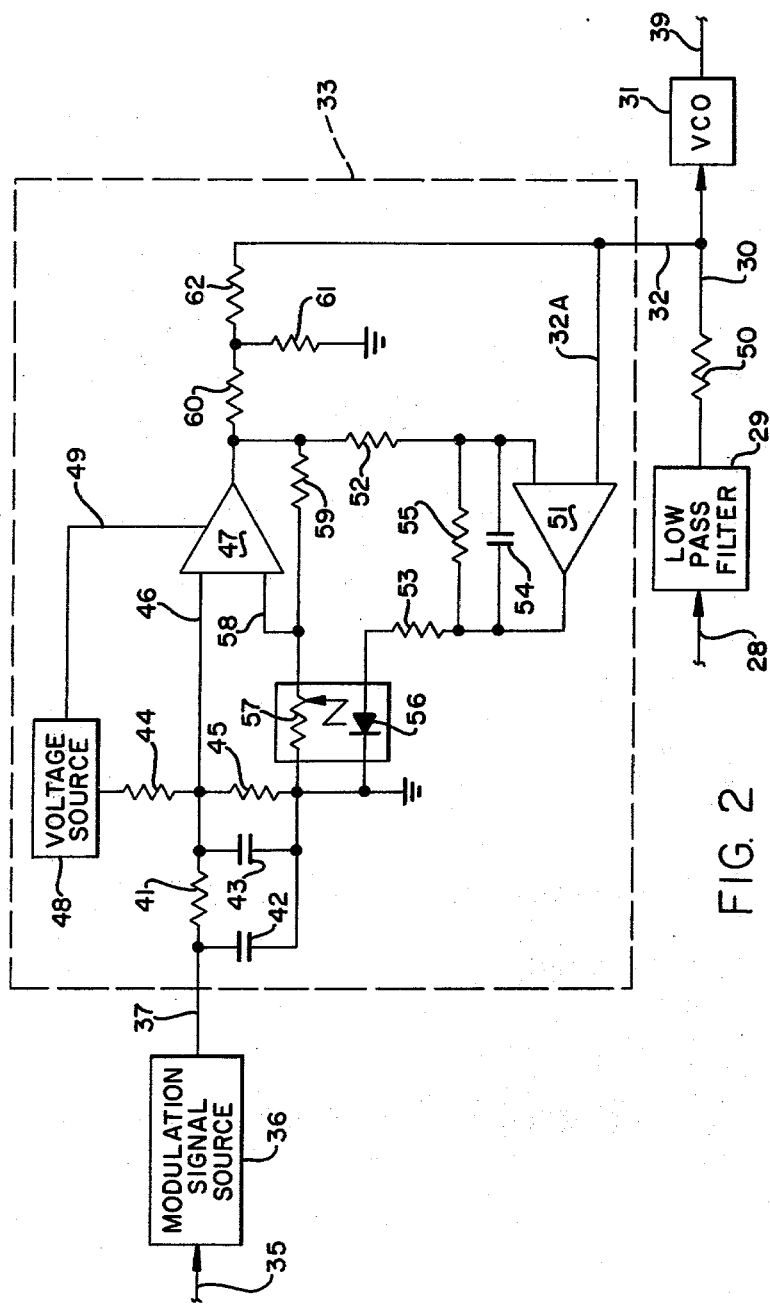

In the drawings:

FIG. 1 represents a block schematic view of a single loop VHF-FM frequency synthesizer, with automatic modulation leveling, connected to VHF signal utilizing equipment; and, FIG. 2 a block schematic of an automatic modulation leveling circuit.

Referring to the drawings:

The single loop VHF-FM frequency synthesizer 10 of FIG. 1 is shown to have a frequency selector control 11 that has 10 MHz, 1 MHz, 100 KHz, and 10 KHz ratio step control output cables 12, 13, 14 and 15, respectively, connected to variable divider 16. The 10 MHz ratio step control cable 12 of control 11 is also connected through branch 12A to shaping network circuit 17 and a mechanical drive connection 18 interconnects control 11 and the 2.5 KHz four step control 19. A selected line in output cable 20 from control 19 provides a switch activating input to the shaping network circuit 17 that has an output line 21 connection to reference oscillator circuit 22. The output of reference oscillator circuit 22 is fed through line 23 as an input to fixed divider circuit 24 that provides a divided signal output through line 25 to a phase detector 26 also receiving the signal output of variable divider 16 as an additional input through line 27. The resulting phase detector output is applied through line 28, low pass filter 29, and line 30 as an input to voltage controlled oscillator (VCO) circuit 31 that also receives a modulation signal input through line 32 and line 30 from automatic leveling circuit 33. Audio input device 34 applies an input through line 35 to modulation signal source circuit 36 that is output connected through line 37 as a signal input to the automatic leveling circuit 33. The VCO circuit output is applied both to VHF utilizing equipment 38 through line 39 and back in loop branch line 39A as a loop input to variable divider 16. A regulated DC voltage source 40 is provided that supplies DC to shaping network circuit 17, the frequency selector control circuit 11, and the 2.5 KHz four step control 19, a switch circuit that may be located with frequency selector control 11.

Refer more specifically to FIG. 2 for a more detailed showing of the automatic leveling circuit 33 along with interconnect detail. The modulation signal output from modulation signal source 36 is applied through line 37 to the junction of resistor 41 and capacitor 42, that is connected to ground, and through resistor 41 to the junction of capacitor 43, resistors 44 and 45 and the terminal input line 46 of amplifier 47. Capacitor 43 is connected to ground and resistors 44 and 45 form a voltage divider between ground and voltage source 48 that also has a DC voltage connection to amplifier 47 through line 49. The tuning voltage passed from low pass filter 29 through resistor 50 to line 30 is passed through line 32 and branch line 32A as tuning voltage input to amplifier 51 and output voltage of amplifier 47 as passed by resistor 52 is also applied as an input to amplifier 51. Variation in the DC output of amplifier 51, as passed through resistor 53 and as affected by the parallel capacitor 54 and resistor 55 interconnect between the resistor 52 connected input of amplifier 51 and the output thereof, varies the current through the LED (light emitting diode) 56 having a cathode connection to ground. This varies the light hitting the photo resistor 57, connected between ground and the input line 58 of amplifier 47, to thereby vary the resistance of photo resistor 57 and thereby the gain of amplifier 47. The output to input loop gain connection of amplifier 47 is established through resistor 59 connected between the amplifier 47 output and the input line 58 junction with photo resistor 57. The output of amplifier 47 is also connected through resistor 60 to the junction of resistor 61, connected to ground, and resistor 62 and through resistor 62 to modulation signal input line 32. In this circuit environment the gain of amplifier 47 is adjusted until its output voltage matches the voltage at the line 32A input to amplifier 51.

In normal operation the gain of amplifier 47 to both DC and AC is set by the ratio of feedback resistor 59 (typical value 33K ohms) to the value of the input resistor 57 (a photo resistor). This causes the signal applied as an input to amplifier 47 through line 46 to be amplified as determined by the DC gain of the circuit that, in turn, has been set by the frequency synthesizer tuning voltage appearing on lines 30, 32, and 32A as an input to amplifier 51. With the gain required to give a certain level of modulation across the RF band being proportional to the tuning voltage leveler, circuit 33 automatically adjusts that gain to the proper level as indicated and determined by the tuning voltage. Amplifier 51 is selected and/or adjusted such as to respond only to the frequency range from DC to approximately 2 Hz so as to ignore AC on the tuning voltage line 30.

This automatic modulation leveling circuit 33 has been implemented in a direct frequency synthesizer 10 (as shown in FIG. 1) used in a new frequency synthesized FM transceiver (not shown). The transceiver covers the frequency range of 150.0000 to 173.9975 MHz in 2.5 KHz increments with direct FM employed, as opposed to phase modulation, so that subaudible tones may be transmitted. It is a transceiver that with the applied modulation the 3 db bandwidth is 30 Hz to 3500 Hz, with standard EIA RS-152-B pre-emphasis response in the voice band, and with the synthesizer a single loop design for cleanness of design and spectral purity. These features are attained through use of a basic 10 KHz increment (with reference oscillator skewing for the four intermediate 2.5 KHz tuning steps in each 10 KHz tuning increment) direct synthesizer with modulation applied to the VCO tuning voltage line 30. The new automatic leveling circuit 33 is provided since the modulation drive requirement to produce the necessary deviation changes between band ends. Thus, with the sensitivity of the VCO to modulation voltage defined as Kv (Hz/volt) the Kv's at band end points and the tuning band center, and the peak modulation voltages (Vp) for ±5 KHz deviation are as follows:

| 150.0000 MHz | $Kv = 4.65 \times 10^6$ | $Vp = 1.07$ mv |
|---|---|---|
| 162.0000 MHz | $Kv = 3.10 \times 10^6$ | $Vp = 1.61$ mv |
| 173.9975 MHz | $Kv = 2.16 \times 10^6$ | $Vp = 2.31$ mv |

The automatic leveling circuit 33 as controlled by the tuning voltage level (Vt) on line 30 provides normalized modulator gain (An) in accord with the following:

| 150.0000 MHz | $Vt = 5.00$ volts | $An = 1.00$ |
|---|---|---|
| 162.0000 MHz | $Vt = 8.10$ volts | $An = 1.50$ |
| 173.9975 MHz | $Vt = 13.50$ volts | $An = 2.16$ |

With the modulator 36 adjusted at 150.0000 MHz to provide ±5 KHz deviation corresponding to a Vp of 1.07 mv the automatic leveling circuit 33 readjusts Vp by virtue of its gain An to maintain ±5 KHz deviation across the entire band.

Whereas this invention is herein illustrated and described with respect to a specific embodiment thereof, it should be realized that various changes may be made without departing from essential contributions to the art made by the teachings hereof.

I claim:

1. An automatic leveling circuit for use in a frequency synthesizer loop wherein direct frequency modulation of the loop output frequency is employed, said loop comprising a phase detector, a voltage controlled output oscillator receiving the output of said phase detector as a frequency controlling input thereto, the output of said voltage controlled oscillator comprising the output of said frequency synthesizer and being additionally applied to a selectively variable frequency divider, the output of a reference oscillator and the output of said frequency divider being applied as respective inputs to said phase detector, loop low pass filter means receiving the output of said phase detector, said voltage controlled oscillator receiving the output of said loop low pass filtering means as a frequency controlling input thereto, said voltage controlled oscillator output comprising a loop defined base frequency which is frequency modulated by a modulation signal source; said automatic leveling circuit comprising a first amplifier connected to receive said modulation signal source as an input thereto; and gain control means for said first amplifier, said gain control means receiving the output of said loop low pass filter and comprising means for developing a DC gain control voltage for said first amplifier as a function of the long term frequency component of the output of said loop low pass filter and exclusive of the FM modulation imposed AC components appearing thereon, and means for summing the output of said first amplifier with the output of said loop low pass filter as applied to said synthesizer voltage controlled oscillator.

2. The automatic modulation leveling circuit of claim 1, wherein said gain control means includes, a light emitting diode; a photo resistor subject to resistance change with light variance of said light emitting diode connected in the gain control circuit of said first amplifier; and circuit means interconnecting the output of said loop low pass filtering means and said light emitting diode for varying power applied to said light emitting diode with change of the voltage on the output of said loop low pass filtering means.

3. The automatic modulation leveling circuit of claim 2, wherein said circuit means interconnecting the output of said loop low pass filtering means and said light emitting diode includes a second amplifier.

4. The automatic modulation leveling circuit of claim 3, wherein said first amplifier has a feedback resistor connected in a gain control circuit with said photo resistor with gain of said first amplifier to both DC and AC set by the ratio of said feedback resistor to the value of said photo resistor.

5. The automatic modulation leveling circuit of claim 4, wherein said photo resistor is an input resistor of said first amplifier.

6. The automatic modulation leveling circuit of claim 5, with said second amplifier having a frequency response such to respond only to frequencies from DC to approximately 2 Hz in order to ignore frequency modulation imposed AC components on the output from said loop low pass filtering means.

7. The automatic modulation leveling circuit of claim 6, wherein said first amplifier has an output connection through a resistor network circuit to the output of said loop low pass filtering means.

8. The automatic modulation leveling circuit of claim 7, wherein said first amplifier also has an output connection through resistive means as an input to said second amplifier.

9. The automatic modulation leveling circuit of claim 8, wherein the output of said loop low pass filtering means is also connected as an input to said second amplifier.

10. The automatic modulation leveling circuit of claim 9, wherein the input connection of said second amplifier from said first amplifier is connected to the output of said second amplifier by parallel resistive means and capacitive means.

* * * * *